(12) United States Patent
Ma et al.

(10) Patent No.: US 11,177,255 B2
(45) Date of Patent: Nov. 16, 2021

(54) TRANSISTOR STRUCTURES HAVING MULTIPLE THRESHOLD VOLTAGE CHANNEL MATERIALS

(71) Applicant: Intel Corporation, Santa Clara, CA (US)

(72) Inventors: Sean T. Ma, Portland, OR (US); Willy Rachmady, Beaverton, OR (US); Gilbert Dewey, Hillsboro, OR (US); Matthew V. Metz, Portland, OR (US); Harold W. Kennel, Portland, OR (US); Cheng-Ying Huang, Hillsboro, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,823

(22) PCT Filed: Jan. 5, 2018

(86) PCT No.: PCT/US2018/012486
§ 371 (c)(1),
(2) Date: Mar. 25, 2020

(87) PCT Pub. No.: WO2019/135756
PCT Pub. Date: Jul. 11, 2019

(65) Prior Publication Data
US 2020/0279845 A1    Sep. 3, 2020

(51) Int. Cl.
*H01L 27/088* (2006.01)
*H01L 29/06* (2006.01)
(Continued)

(52) U.S. Cl.
CPC ...... *H01L 27/088* (2013.01); *H01L 21/02543* (2013.01); *H01L 21/02546* (2013.01);
(Continued)

(58) Field of Classification Search
CPC ............. H01L 27/088; H01L 21/02543; H01L 21/02546; H01L 21/02603;
(Continued)

(56) References Cited

U.S. PATENT DOCUMENTS

2014/0237275 A1    8/2014    Zanotelli et al.
2014/0264379 A1    9/2014    Kub et al.
(Continued)

FOREIGN PATENT DOCUMENTS

KR    1020170059378    5/2017
WO    2017171860    10/2017

OTHER PUBLICATIONS

International Search Report & Written Opinion dated Oct. 5, 2018, for PCT Patent Application No. PCT/US2018/012486.
(Continued)

*Primary Examiner* — Tong-Ho Kim
(74) *Attorney, Agent, or Firm* — Green, Howard & Mughal LLP

(57) ABSTRACT

Embodiments include a first nanowire transistor having a first source and a first drain with a first channel in between, where the first channel includes a first III-V alloy. A first gate stack is around the first channel, where a portion of the first gate stack is between the first channel and a substrate. The first gate stack includes a gate electrode metal in contact with a gate dielectric. A second nanowire transistor is on the substrate, having a second source and a second drain with a second channel therebetween, the second channel including a second III-V alloy. A second gate stack is around the second channel, where an intervening material is between (Continued)

the second gate stack and the substrate, the intervening material including a third III-V alloy. The second gate stack includes the gate electrode metal in contact with the gate dielectric.

20 Claims, 11 Drawing Sheets

(51) Int. Cl.
- *H01L 29/423* (2006.01)
- *H01L 29/49* (2006.01)
- *H01L 29/786* (2006.01)
- *H01L 21/02* (2006.01)
- *H01L 21/28* (2006.01)
- *H01L 29/66* (2006.01)
- *H01L 21/8252* (2006.01)

(52) U.S. Cl.
CPC .. *H01L 21/02603* (2013.01); *H01L 21/28264* (2013.01); *H01L 21/8252* (2013.01); *H01L 29/0673* (2013.01); *H01L 29/42392* (2013.01); *H01L 29/4908* (2013.01); *H01L 29/66522* (2013.01); *H01L 29/66742* (2013.01); *H01L 29/78618* (2013.01); *H01L 29/78681* (2013.01); *H01L 29/78696* (2013.01)

(58) Field of Classification Search
CPC ........... H01L 21/28624; H01L 21/8252; H01L 29/0673; H01L 29/42392; H01L 29/4908; H01L 29/66522; H01L 29/66742; H01L 29/078618; H01L 29/78681; H01L 29/78696
USPC ........................................................ 257/350
See application file for complete search history.

(56) References Cited

U.S. PATENT DOCUMENTS

| | | |
|---|---|---|
| 2014/0346564 A1 | 11/2014 | Doornbos et al. |
| 2017/0263706 A1* | 9/2017 | Gardner ............ H01L 29/42392 |

OTHER PUBLICATIONS

International Preliminary Report on Patentability from PCT/US2018/012486 dated Jul. 16, 2020, 12 pgs.

* cited by examiner

TRANSISTOR STRUCTURES HAVING MULTIPLE THRESHOLD VOLTAGE CHANNEL MATERIALS

CLAIM OF PRIORITY

This Application is a National Stage Entry of, and claims priority to, PCT Patent Application No. PCT/US2018/012486, filed on Jan. 5, 2018 and titled "TRANSISTOR STRUCTURES HAVING MULTIPLE THRESHOLD VOLTAGE CHANNEL MATERIALS", which is incorporated by reference in its entirety for all purposes.

BACKGROUND

Metal oxide silicon (MOS) fabrication technology may be used for fabricating microelectronic devices, such as field effect transistors (FET). Such FET transistors may include trigate FET structures, and gate all around transistors as well as nanowire transistors. In some FET transistor structures, a threshold voltage may be varied by using gate stack materials with different work functions, or by doping a channel region of a transistor with varying types and amounts of one or more of a dopant species, by using an implant process and/or a dopant source, for example. However, current leakage may present a problem when fabricating transistor devices utilizing such process techniques.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
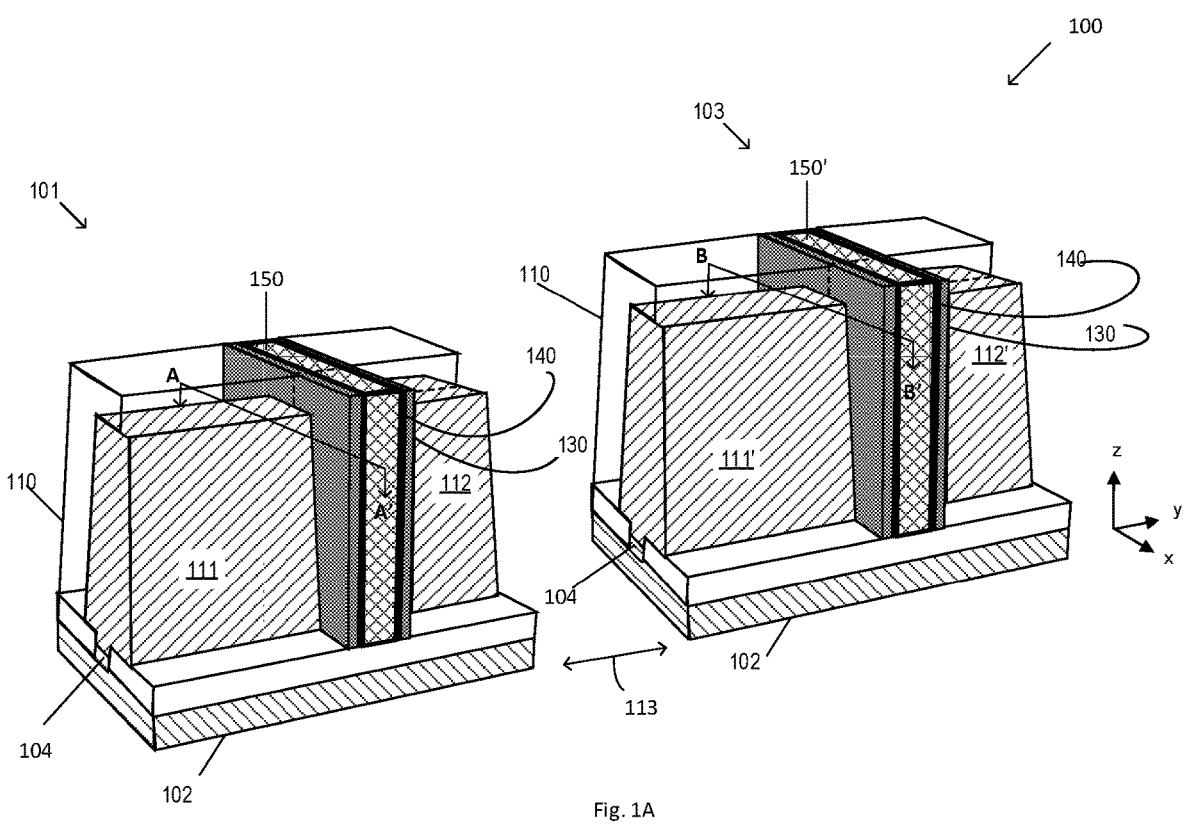
FIG. 1A illustrates a three-dimensional (3D) view through lengths of source/drain regions of a first and a second nanowire transistor with multiple threshold voltage channel materials, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor structures, such as nanowire transistor, providing multiple threshold voltages. The threshold voltages of the transistor structures herein may be modulated by incorporating different III-V channel materials. In an embodiment, heteroepitaxial growth techniques may be utilized to form a first transistor channel material. The first transistor has a first threshold voltage associated with a given channel material. A second transistor channel material may be formed with heteroepitaxial growth techniques. The second channel material has a second threshold voltage associated with a given electrode material. The first transistor may be formed on a first region of the substrate, and the second transistor may be formed on a second region of the substrate by utilizing any suitable pattering techniques. The III-V alloy compositions of the channel materials can be tailored to threshold voltages suitable for multiple cores on a chip, in an embodiment.

Different III-V channel materials not only enable an integrated circuit to have a range of different threshold voltages, but also impact different on-state current and off-state leakage values. The embodiments herein may therefore enable the fabrication of low power circuits/cores that have both a higher threshold voltage and a lower off-state leakage than transistors employed in high performance circuits/cores. The embodiments herein may be applied to a variety of transistor architectures, such as, but not limited to, nanowire transistor structures, dual gate and trigate transistor structures.

Embodiments include a first nanowire transistor having a first source and a first drain with a first channel in between the first source and the first drain, where the first channel includes a first III-V alloy. A first gate stack is around the first channel, for example with a portion of the first gate stack adjacent to a sidewall of the channel and another portion of the first gate stack between the first channel and an underlying substrate. The first gate stack may include a gate electrode metal in contact with a gate dielectric. A second nanowire transistor may have a second source and a second drain with a second channel between the second source and the second drain. The second channel may include a second III-V alloy having a different composition than the first III-V alloy. A second gate stack is around the second channel, for example with a portion of the second gate stack adjacent to a sidewall of the second channel and another portion of the second gate stack between the second channel and an intervening material between the second gate stack and the substrate. This intervening material may, for example, facilitate forming the first gate stack between the substrate and the first channel. The intervening material may be a third III-V alloy, for example. The second gate stack may include the same gate electrode metal in contact with the gate dielectric.

FIG. 1A is an isometric view of a device 100, arranged in accordance with embodiments of the present disclosure. Device 100 includes a nanowire transistor 101 and a nanowire transistor 103 over a substrate 102. Transistors 101 and 103 are laterally separated from each other by a distance 113. Transistors 101, 103 have III-V channel materials that differ sufficiently from each other to result in significantly different threshold voltages, in accordance with some embodiments.

The substrate 102 may be any material suitable for an integrated circuit, such as, but not limited to, crystalline semiconductor materials, glasses, ceramics, and polymers. In some embodiments, the substrate 102 includes silicon, and may be a monocrystalline silicon substrate, for example. In some embodiments, the substrate 102 may also include alternate materials, which may or may not be combined with silicon, including, but not limited to, germanium, indium antimonide, lead telluride, indium arsenide, indium phosphide, gallium nitride, gallium arsenide, or gallium antimonide, carbon (SiC), and sapphire. In some embodiments, the substrate 102 includes a dielectric layer such as a buried oxide (BoX). In an embodiment, the substrate 102 may include n-type donor, or p-type acceptor impurities, for example.

In some embodiments, the substrate 102 includes circuit elements, such as transistors and passive elements, for example. In an embodiment, substrate 102 is a portion of a CMOS substrate, for example having p-type metal oxide semiconductor (PMOS) and n type metal oxide semiconductor (NMOS) transistors.

Although in the example illustrated in FIG. 1A, transistors 101, 103 are nanowire transistors with a gate all around (GAA) architecture, in alternative embodiments, transistors 101, 103 may each be a trigate transistor, a dual gate transistor, a single gate transistor, an omega-gate transistor, or any other type of transistor.

In the example shown in FIG. 1A, a buffer layer 104 is over the substrate 102. In an embodiment, the buffer layer 104 an alloy of gallium, such as but not limited to gallium arsenide, or indium gallium arsenide. However, the buffer layer 104 may include any other suitable materials, including other III-V alloys.

An isolation dielectric material 110 is over a portion of the substrate 102, adjacent to the buffer layer 104. Isolation dielectric material 110 is also adjacent source (drain) 111, source (drain) 111', drain (source) 112, and drain (source) 112'. The isolation material may comprise any suitable dielectric material, that may electrically isolate source 111, 111' and drain 112, 112' regions. The isolation material 110 may include any suitable material, such as, but not limited to silicon dioxide, and may include any shallow trench isolation (STI) materials. The isolation material 110 may include such materials as carbon doped oxide (CDO), silicon nitride, silicon oxynitride, silicon carbide, organic polymers such as perfluorocyclobutane or polytetrafluoroethylene, fluorosilicate glass (FSG), and/organosilicates such as silsesquioxane, siloxane, or organosilicate glass, in embodiments. In an embodiment, the isolation material 110 may include multiple layers of different materials. In some embodiments, an aspect ratio trapping (ART) trench may extend through the isolation material 110 with buffer layer 104 at the bottom of the ART trench.

The source and drain regions 111, 111', 112, 112' may include any suitable impurities or dopants such as, but not limited to, boron, aluminum, antimony, phosphorous, or arsenic. A dielectric spacer 130 separates source and drain regions 111, 111', 112, 112' (e.g. in the y-dimension) from gate electrodes 150, 150'. The dielectric spacer 130 may be any suitable material, such as, but not limited to silicon nitride, silicon oxide, silicon carbide, silicon nitride doped with carbon, and silicon oxynitride. In an alternate implementation, transistors may include a plurality of spacers. For example, two pairs, three pairs, or four pairs of sidewall spacers may be along a sidewall of the gate electrodes 150, 150'.

The gate electrodes 150, 150' may be over a top surface of transistor channel region(s), and may extend a lateral length (e.g., in the x-dimension) over the portions of the isolation dielectric region 110. In some embodiments, gate electrode 150, 150' materials include at least one P-type work function metal or an N-type work function metal, depending on whether the transistors 101, 103 are a PMOS or an NMOS transistor. In some implementations, gate electrode 150, 150' material includes a stack of two or more metal layers. A P-type metal layer suitable as a PMOS gate electrode may have a work function that is between about 4.9 to about 5.2 eV, for example. In some PMOS transistor embodiment, the gate electrode 150 includes at least one of ruthenium, palladium, platinum, cobalt, nickel, or a conductive metal oxide (e.g., ruthenium oxide).

For an NMOS transistor, an N-type metal layer may be used within an NMOS gate electrode. An N-type metal may have a work function between about 3.9 eV and about 4.2 eV, for example. In some NMOS transistor embodiments, the gate electrode 150 includes at least one of hafnium, zirconium, titanium, tantalum, aluminum, alloys of these metals, and carbides of these metals such as hafnium carbide, zirconium carbide, titanium carbide, tantalum carbide, and aluminum carbide.

A gate dielectric material 140 is between the gate electrode 150 and channel regions (not shown) of transistors 101, 103. The gate dielectric material 140 may include one or more of any material known in the art to be suitable for a FET gate dielectrics (and/or channel passivation) and may include a high-K dielectric (e.g., having a dielectric constant greater than that of silicon nitride (Si3N4)), such as, but not limited to, high-K oxides such as gadolinium oxide (Gd2O3), hafnium oxide (HfO2), high-K silicates such as HfSiO, TaSiO, AlSiO, and high-K nitrides such as HfON. Other suitable gate dielectric materials may include elements such as hafnium, silicon, oxygen, titanium, tantalum, lanthanum, aluminum, zirconium, barium, strontium, yttrium, lead, scandium, niobium, and zinc. Other examples of high-k materials may include, but are not limited to, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer may include one layer or a stack of layers.

Figure 1B:
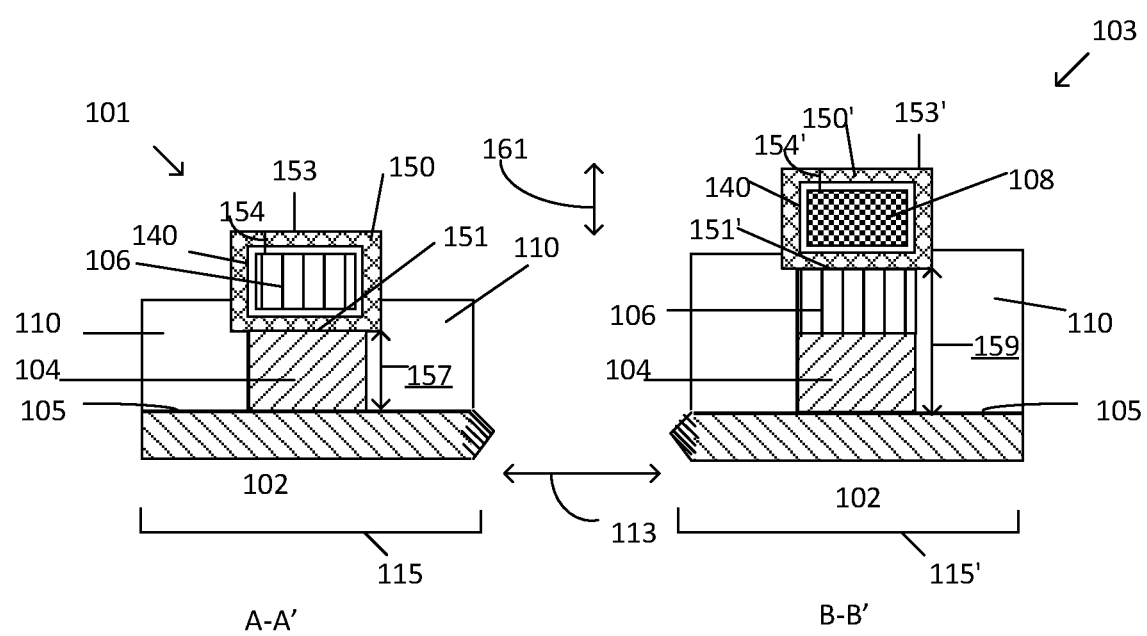
FIG. 1B illustrates a three-dimensional (3D) view through lengths of gate electrode regions of a first and a second nanowire transistor with multiple threshold voltage channel materials, according embodiments.

FIG. 1B illustrates cross sectional views along sections A-A' and B-B' for the transistor devices 101, 103 of FIG. 1A, respectively. The first transistor 101, which may be a first nanowire transistor, may have a buffer layer 104 over the substrate 102. The buffer layer 104 is an epitaxial buffer layer, in an embodiment. The buffer layer 104 is adjacent the isolation dielectric material 110, in an embodiment. A first III-V alloy 106 is over the buffer layer 104, in an embodiment. In an embodiment, a portion of the isolation dielectric material 110 is adjacent a sidewall of the first III-V alloy 106, and another portion of the first III-V alloy 106 is free of the isolation dielectric material 106.

In an embodiment, the first III-V alloy 106 includes one or more of indium gallium arsenide (InGaAs), indium arsenide (InAs), indium antimonide (InSb), indium gallium antimonide, (InGaSb), indium gallium arsenide antimonide (InxGa1-xAsySb1-y), indium gallium arsenide phosphide (InxGa1-xAsyP1-y), indium gallium phosphide antimonide (InxGa1-xPySb1-y), indium aluminum arsenide antimonide (InxAl1-xAsySb1-y), indium aluminum arsenide phosphide (InxAl1-xAsyP1-y). In an embodiment, the first III-V alloy 106 is a binary, ternary or a quaternary alloy of the above listed materials.

In an embodiment, the first III-V alloy 106 is a first channel material 106 of the first nanowire transistor 101. In an embodiment, the first III-V alloy 106 has a thickness of between about 5 nm to about 50 nm, (and may be measured from a surface 105 of the substrate 102 to a first side 151 of the gate electrode 151), but may vary depending upon the particular application. In an embodiment, the first III-V alloy 106 has a first bandgap, where the first band gap is relatively narrow. For example, the first band gap may be between about 0.35 eV to about 0.75 eV. In an embodiment, a first gate stack 154 is around the first III-V alloy 106. The first gate stack 154 may include the gate electrode 150 disposed around the gate dielectric 140, where the gate dielectric 140 is around the first III-V alloy 106. In an embodiment, a portion of the first gate stack 154 may be between a first surface 105 of the substrate 102 and a portion of the first III-V alloy 106. In an embodiment, another portion of the first gate stack 154 may be on a sidewall of the first III-V alloy 106. In an embodiment, a first distance 157 may be between the first surface 105 of the substrate 102 and the first side 151 of the first gate stack 154. For example, the first distance 157 may be in the range of about 10 nm to about 80 nm. The first transistor 101 may be a low threshold voltage device, in an embodiment.

The second transistor 103, which may include a second nanowire transistor 103, may be over the substrate 102, and may be a distance 113 from the first transistor 101. The first transistor 101 may be on a first region 115 on the substrate 102, and the second transistor 103 may be on a second region 115' of the substrate 102. The first and second transistors 101, 103 may be separated from each other on the substrate 102 due to patterning steps which will be discussed further herein.

In an embodiment, the second transistor 103 includes the first III-V alloy 106 on the buffer layer 104. In an embodiment, the dielectric isolation material 110 is disposed on the entire portion of sidewalls of the first III-V alloy 106 of the second transistor 103, unlike the first transistor 101, where the dielectric isolation material 110 is adjacent to only a portion of sidewalls of the first III-V alloy 106 and is separated from the sidewalls by the first gate stack 154.

A second III-V alloy 108 is over the first III-V alloy 106 of the second transistor 103, and in an embodiment, is an epitaxial layer on the first III-V alloy 106. In an embodiment, a portion of the isolation dielectric material 110 is adjacent a portion of the second III-V alloy 108, however a portion of the sidewalls of the second III-V alloy 108 are free of the isolation dielectric material. In an embodiment, the second III-V alloy 108 includes one or more of gallium arsenide (GaAs), indium phosphide (InP), gallium phosphide (GaP), gallium arsenide (GaAs), indium gallium phosphide (InGaP), aluminum gallium arsenide (AlxGa1-xAs), gallium arsenide antimonide (GaAsxSb1-x) (where 0≤x≤1), indium gallium arsenide antimonide (InxGa1-xAsySb1-y), indium gallium arsenide phosphide (InxGa1-xAsyP1-y), indium gallium arsenide phosphide antimonide (InxGa1-xPySb1-y), indium aluminum arsenide antimonide (InxAl1-xAsySb1-y), indium aluminum arsenide phosphide (InxAl1-xAsyP1-y), indiumgallium zinc oxide (IGZO), or combinations thereof.

In another embodiment, the second III-V alloy 108 includes any suitable III-V material and its alloys. In another embodiment, the second III-V alloy 108 is an amorphous semiconductor material, such as hydrogenated amorphous silicon (a-Si:H), polysilicon, zinc oxide (ZnO), indium gallium zinc oxide (IGZO), indium-zinc oxide (IZO), indium-molybdenum oxide (IMO), and zinc-tin oxide (ZTO), for example.

In other embodiments, the second III-V alloy 108 includes one or more of a polycrystalline semiconductor material such as, but not limited to, zinc oxynitride (ZnON, zinc oxide (ZnO) zinc nitride (Zn3N2), ZnO, ZnOxNy, and Zn3N2), indium tin oxide (ITO), tin oxide (e.g., SnO), copper oxide (e.g., Cu2O), polycrystalline germanium (poly-Ge), or silicon-germanium (e.g., SiGe, such as Si1-xGex) structures (such as a stack of poly-Ge over SiGe). In an embodiment, the second III-V alloy 108 may have a first conductivity type, such as an N-type or a P-type channel material. N-type channel material may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, or poly-III-V, such as indium arsenide (e.g., InAs). P-type channel material may include one or more of amorphous silicon (a-Si), zinc oxide (e.g., ZnO), amorphous germanium (a-Ge), polysilicon (polycrystalline silicon or poly-Si), poly germanium (polycrystalline germanium or poly-Ge), poly-III-V materials such as InAs, copper oxide (CuO), and tin oxide (SnO), or any chalcogenide glass, including, but not limited to, germanium antimony tellurium (GexSbyTez).

In another embodiment, the second III-V alloy 108 may be a binary, a ternary or a quaternary alloy of the above listed materials. In an embodiment, the second III-V alloy 108 is a second channel material 108 of the second nanowire transistor 103. In an embodiment, the second III-V alloy 108 has a thickness of between about 5 nm to about 50 nm, but may vary depending upon the particular application. In an embodiment, the second III-V alloy 108 has a second bandgap, where the second band gap is relatively wide, and may be larger than the first bandgap of the first III-V alloy 106. In an embodiment, the second band gap is between about 1.4 eV to about 3.5 eV.

In an embodiment, the first III-V alloy 106 includes a first lattice constant, and the second III-V alloy 108 includes a second lattice constant, where the first and the second lattice constants are substantially matched with each other. In an embodiment, the lattice constants of the first and the second III-V alloys 106, 108 are within about 10 percent of each other.

A second gate stack 154' is around the second III-V alloy 108. The second gate stack 154' includes the gate electrode 150 around and on the gate dielectric 140, where the gate dielectric 140 is around the second III-V alloy 108. In an embodiment, a portion of the second gate stack 154' is between a first surface 105 of the substrate 102 and the first side 151' of the second gate stack 154' of the second transistor 103. In an embodiment, a second distance 159 is between the first surface 105 of the substrate 102 and the first side 151' of the second gate stack 154'. In an embodiment, the second distance 159 of the second transistor 103 may be greater than the first distance 157 of the first transistor 101. In an embodiment, a distance 161 is between a second surface 153 of the first gate stack 154 and a second surface 153' of the second gate stack 154', such that the second gate stack 154' of the second transistor 103 is higher than the first gate stack 154 of the first transistor 101, relative to the substrate 102 surface 105, and relative to each other. In an embodiment, the first III-V alloy 106 of the second transistor 103 may be an intervening material that is between the second gate stack 154' and the substrate 102, where the intervening material is a third III-V alloy.

In an embodiment, the gate stack materials 154, 154' of the first transistor 101 and the second transistor 103 are the same, while in other embodiments, gate electrode 150 material and gate dielectric 140 material differ between the two transistors 101, 103. In an embodiment, the gate electrode material 150 has a first work function difference with the first III-V alloy 106 on the first transistor, and has a second work function difference with the second III-V alloy 108 on the second transistor 103. In an embodiment, the first work function difference is smaller than the second work function difference, and the first transistor 101 has a first threshold voltage (Vt), that is smaller than a second Vt of the second transistor 103. Both low power and high-performance cores/circuits are enabled on the same substrate by incorporating the embodiments herein.

Figure 2:
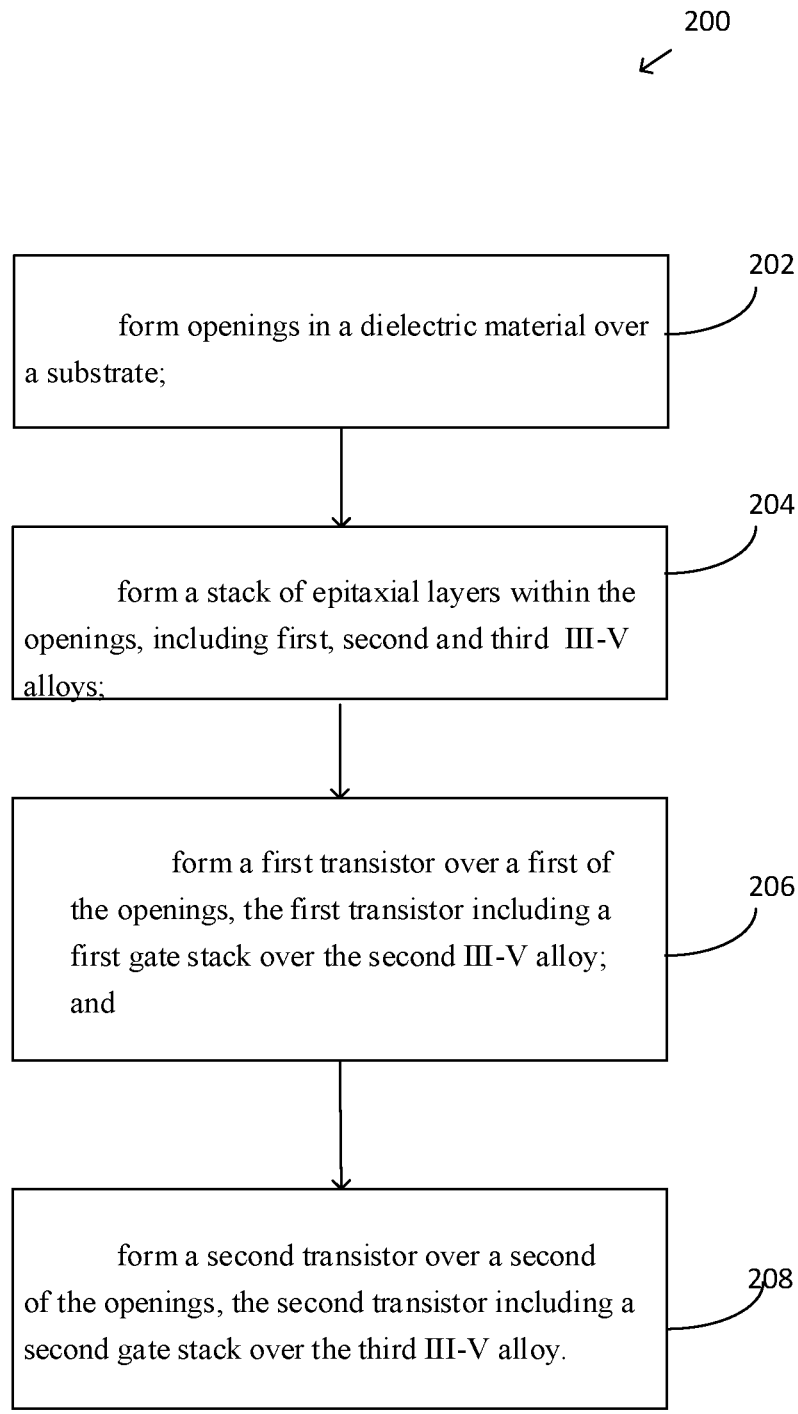
FIG. 2 is a flow diagram illustrating a method of fabricating nanowire transistors with multiple threshold voltage channel materials, according to embodiments.

FIG. 2 depicts a flow chart of methods of forming multiple threshold voltage transistor structures by incorporating different III-V channel materials for each transistor, according to embodiments. The nanowire transistor structures described herein may be fabricated by a variety of methods practicing a variety of techniques.

At operation 202, openings may be formed in a dielectric material over a substrate. The substrate may comprise any suitable substrate, such as described previously herein. The dielectric material may comprise a trench isolation material, such as a field isolation material or a shallow trench isolation material. The dielectric material is an ART trench material, in an embodiment. The openings may be formed utilizing any suitable etching process, such as a plasma etch, or a wet etch, for example. The openings may be formed such that a ratio of a depth of the openings to a width of the openings may be at least about 2:1. The openings be formed such that they expose an underlying portion of the substrate, upon which an epitaxial growth process may be performed.

At operation 204, a stack of epitaxial layers may be formed over the substrate and within the openings, where the stack is a first layer including a first III-V alloy over the substrate, a second layer including a second III-V alloy over the first layer, and a third layer including a third III-V alloy over the second layer. In an embodiment, the first layer, which may be a buffer layer, is formed/grown on the exposed substrate within the trench. The first layer may be formed utilizing any epitaxial growth technique, such as, but not limited to, metal-organic chemical vapor deposition (MOCVD), molecular beam epitaxy (MBE), or hydride vapor phase epitaxy (HVPE).

Growth of the first III-V alloy is selective to the substrate seeding surface, backfilling the trench in the surrounding amorphous trench material. The second III-V alloy may be epitaxially grown from a surface of the first III-V alloy, followed by planarization with the trench isolation material. A portion of the second III-V alloy may then be recessed in the opening. In an embodiment, the third III-V alloy is then grown on the second III-V alloy, where the second III-V alloy is formed of materials which have a smaller band gap than the materials of the third III-V alloy. Feed gases and other epitaxial process control parameters (e.g., temperature, partial pressures, etc.) are changed for each of the first, second and third III-V alloy layers, as required to grow the different materials, however a single formation tool may be used so that vacuum may not be broken between successive epitaxial processes. A polish may be performed to planarize a top surface of the epitaxial stack with a top surface of the surrounding dielectric.

At operation 206, a first transistor may be formed over a first of the openings, the first transistor including a first gate stack over the second layer, where the first gate stack includes a gate electrode metal in contact with a gate dielectric in contact with the second III-V alloy. To form the first transistor, a dielectric material over the first opening is recessed to expose sidewalls of the second III-V alloy, while the epitaxial stack in the second opening is protected with a resist material. A gate dielectric material is then formed around the second III-V alloy, where the second III-V alloy is the channel material for the first transistor. Any known deposition processes may be employed in the formation of the gate dielectric material, such as atomic layer deposition (ALD), for example. A gate electrode is then formed around the gate dielectric layer. A portion of the second III-V alloy is replaced with a portion of the second gate stack, in an embodiment. The first transistor is a low Vt transistor, in an embodiment.

At operation 208, a second transistor may be formed over a second of the openings, the second transistor including a second gate stack over the third layer, where the second gate stack also includes the gate electrode metal in contact with the gate dielectric, and where the gate dielectric is in contact with the third III-V alloy. In an embodiment, a resist material is formed over the first transistor, and a dielectric material adjacent to the second opening is recessed to expose a sidewall of the third III-V alloy. A gate dielectric material is then formed around the third III-V alloy, where the third III-V alloy is the channel material for the second transistor. Any known deposition processes may be employed in the formation of the gate dielectric material, such as ALD, for example. The gate electrode is then formed around the gate dielectric layer of the second transistor. The gate electrode may be formed using any suitable deposition process, such as a physical vapor deposition process, or a chemical vapor deposition process, for example. A portion of the third III-V alloy is replaced with a portion of the third gate stack, in an embodiment. The second transistor is a high Vt transistor, in an embodiment.

By fabricating different channel materials for the two transistors, devices comprising different threshold voltages may be fabricated. The multiple threshold voltage III-V channel material devices formed herein are in suitable ranges required for high performance and low power cores on a chip, for example, where specific transistor threshold voltages may be tuned by channel material engineering to achieve desired threshold voltages for a specific application.

Figure 3A:
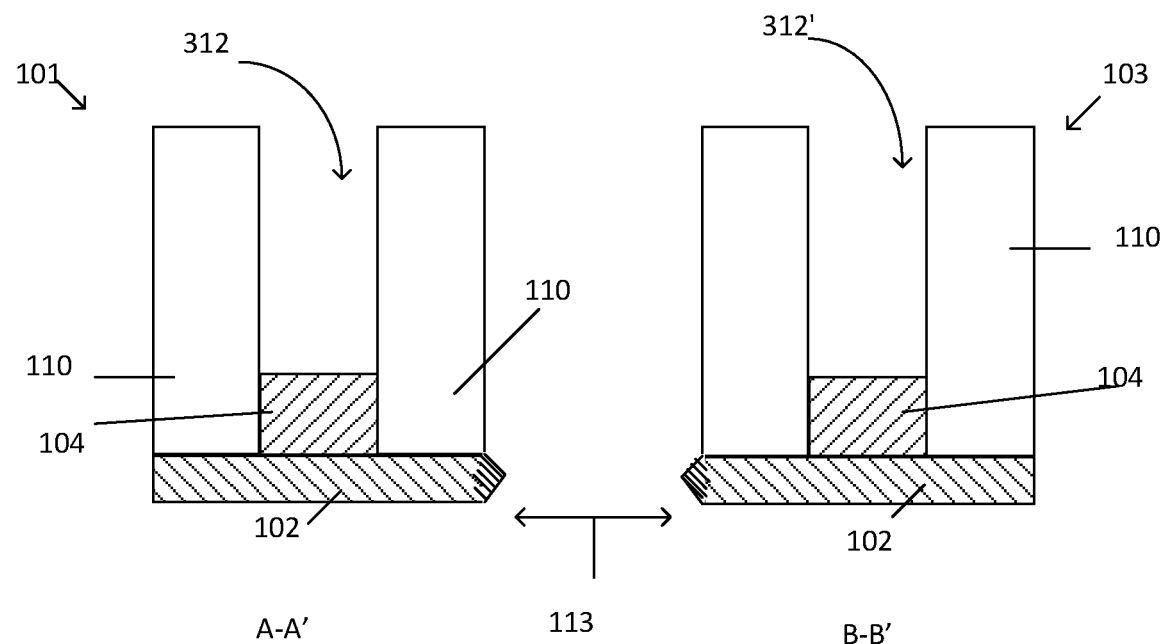
FIGS. 3A-3H illustrate cross-sectional views through widths of channel regions of a first and a second nanowire transistor with multiple threshold voltage channel materials, according to embodiments.

FIGS. 3A-3H depict cross-sectional views of first and a second transistors, where the first and second transistors are nanowire transistors, in an embodiment. III-V channel materials are incorporated into the transistors and serve to tune a Vt for each transistor, such that multiple Vt devices may be fabricated on the same substrate. In FIG. 3A, cross sectional views of channel regions along A-A', B-B' (of FIG. 1A, for example) are illustrated for a first transistor 101 and a second transistor 103, respectively. The substrate 102 includes the buffer layer 104 on the substrate 102 surface. In an embodiment, the buffer layer 104 is a III-V alloy, and is a gallium arsenide or an indium gallium arsenide, for example. Isolation material 110, which is a trench isolation material, in an embodiment, is over the substrate. Openings 312, 312' are ART trench openings, and have aspect ratios of greater than about 2:1, in an embodiment. In other embodiments, the aspect ratio may be 1.5, 1.7, 1.9, 2.1, 2.3, 2.5, or 2.7, for example. In an embodiment, a distance 313 may separate the first and second transistors 101, 103 on the substrate 102.

Figure 3B:
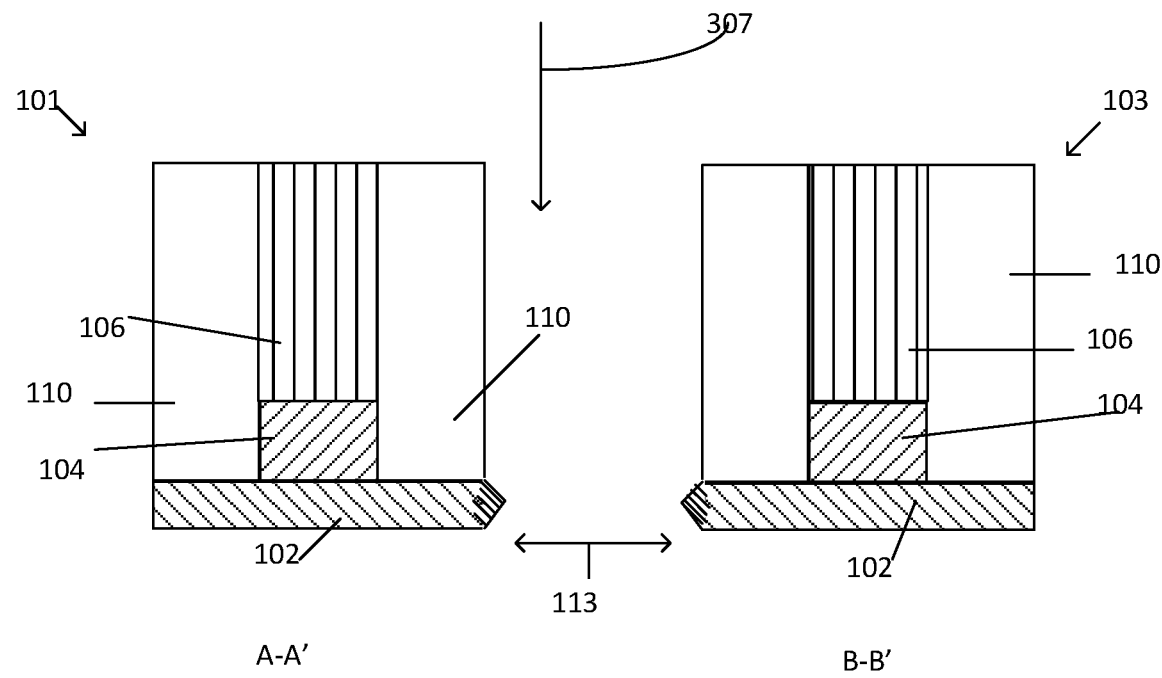
Figure 3C:
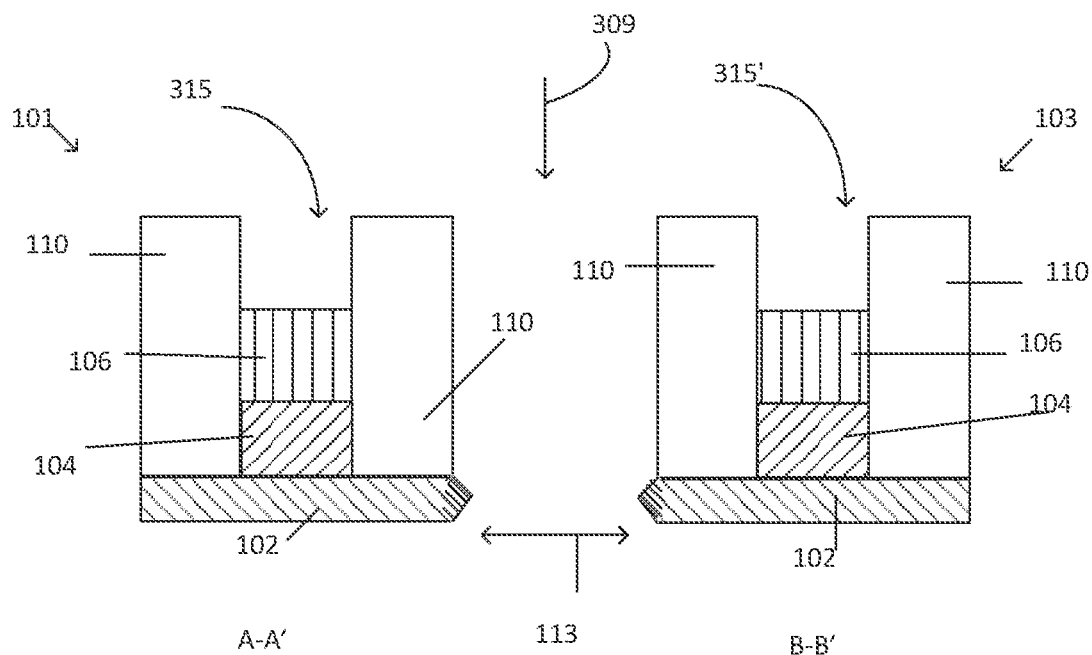
Figure 3D:
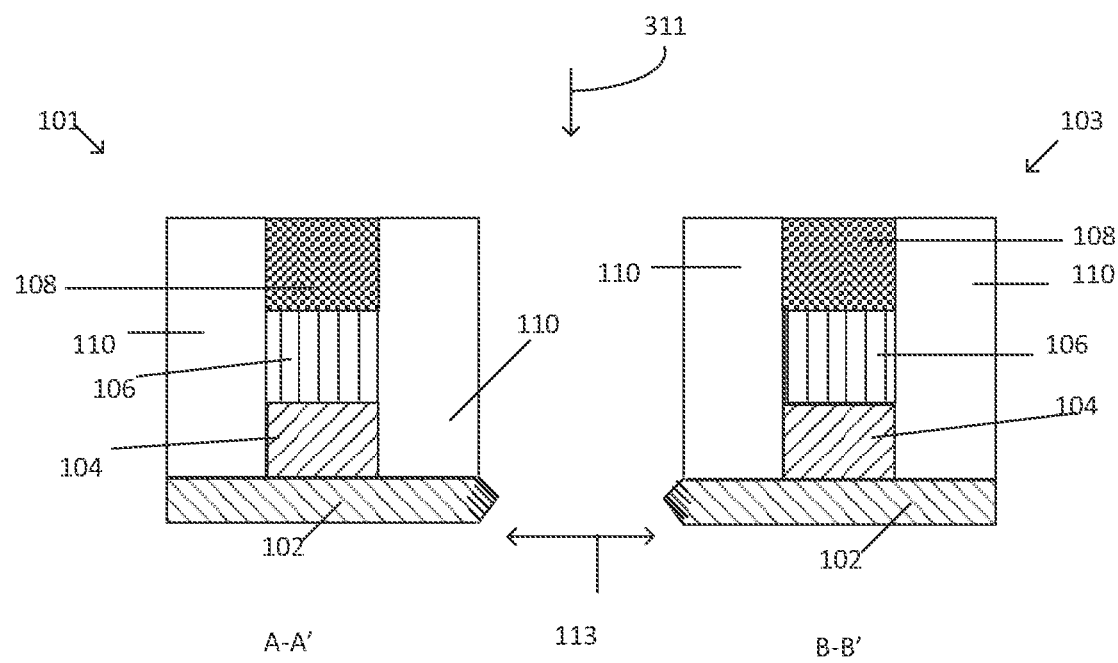

In FIG. 3B, a first III-V alloy 106 is formed over the buffer layer 104 within the openings 319, 319' of the first and second transistors 101, 103. In an embodiment, the first III-V alloy 106 is indium gallium arsenide, and is formed by utilizing any suitable epitaxial process 307. In an embodiment, the first III-V alloy 106 and the isolation material 110 are planarized, such that a top surface of the first III-V alloy 106 and a top surface of the isolation material 110 are coplanar. In FIG. 3C, a portion of the first III-V alloy 106 is removed, utilizing a recessing process 309, for example, where openings 315, 315' are formed over the first III-V alloys 106 of the first and second transistors 101, 103. In FIG. 3D, a second III-V alloy 108 is formed on the first III-V alloy 106 by utilizing a formation process, such as an epitaxial growth process 311, in an embodiment. In an embodiment, the second III-V alloy 108 is indium phosphorus. In an embodiment, top surfaces of the second III-V alloy and top surfaces of the isolation material 110 are planarized.

Figure 3E:
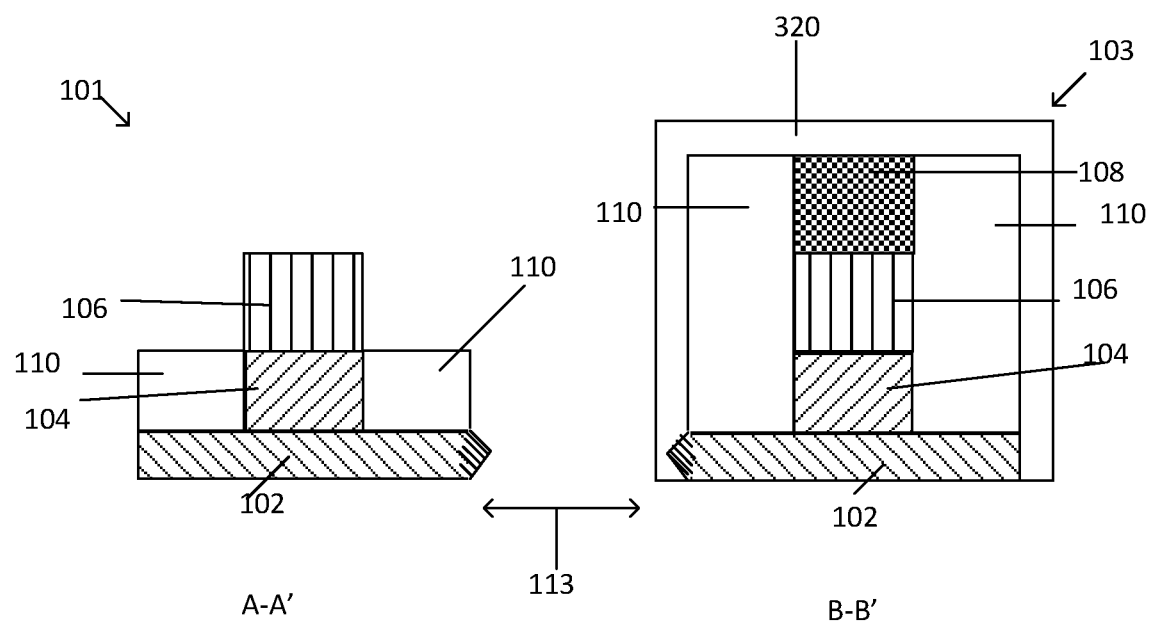
Figure 3F:
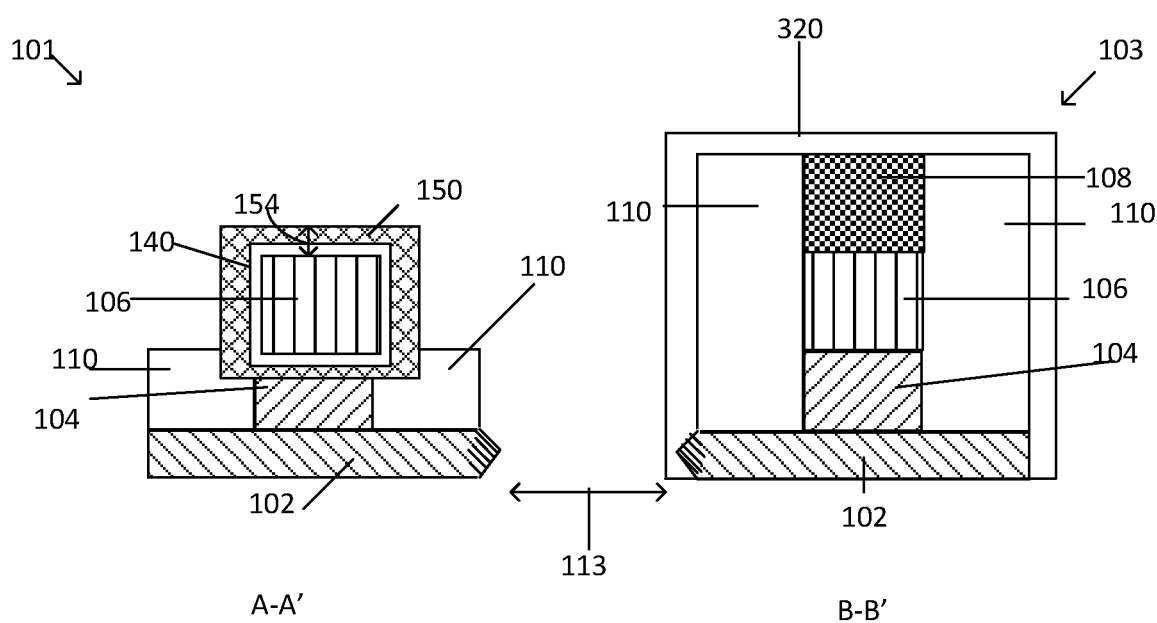

In FIG. 3E, the second III-V alloy 108 is selectively removed from the first transistor 101, while a patterning material 320, such as a resist material, for example, formed over the second transistor 103 protects the second III-V alloy 108 of second transistor 103. In an embodiment, a plurality of second transistors 103 may be masked, and a plurality of low Vt transistors may be formed in unmasked portions of the substrate 102. The second III-V alloy 108 remains on the first III-V alloy 106 of the second transistor 103. The isolation material 110 of the first transistor 101 is recessed to expose the sidewalls of the first III-V alloy 106 of the first transistor 101. In FIG. 3F, a first gate stack 154 is formed on the first III-V alloy 106 of the first transistor 101. In an embodiment, the first gate stack 154 includes a gate material 150 disposed on a gate dielectric 140. To form the gate stack 154, a gate dielectric 140 is initially formed around the first III-V alloy, and then a gate electrode material is formed around the gate dielectric. The first III-V alloy 106 may be a low threshold voltage channel material, where the first transistor 101 may be a low Vt device. In an embodiment, a plurality of low Vt devices 101 may be formed in desired locations on the substrate 102, and may be separated from a region of high Vt devices by a distance 213.

Figure 3G:
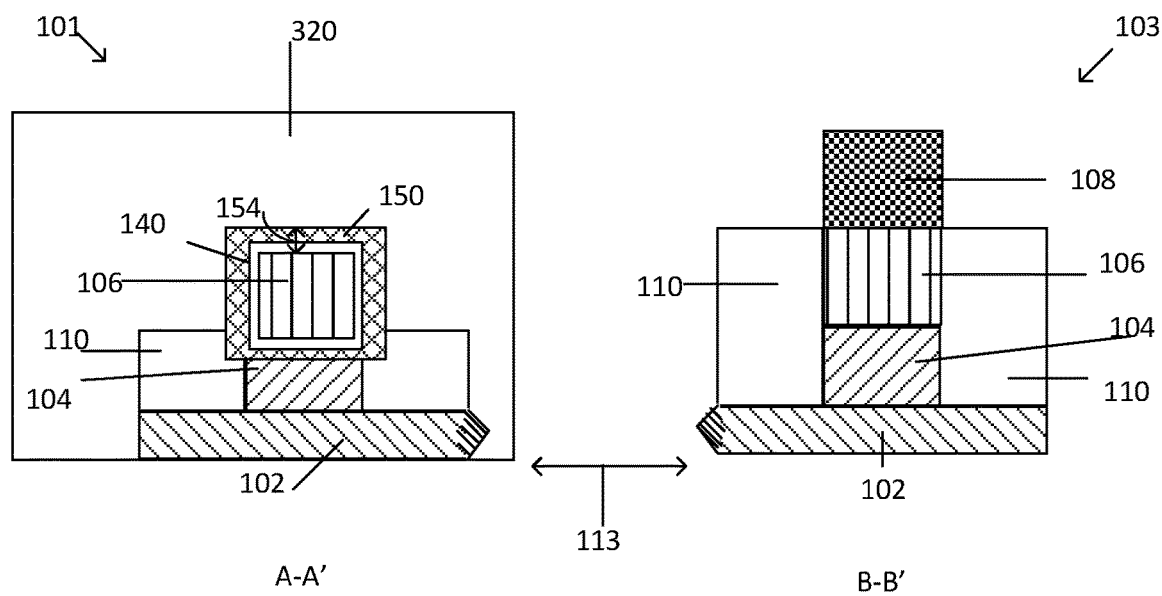
Figure 3H:
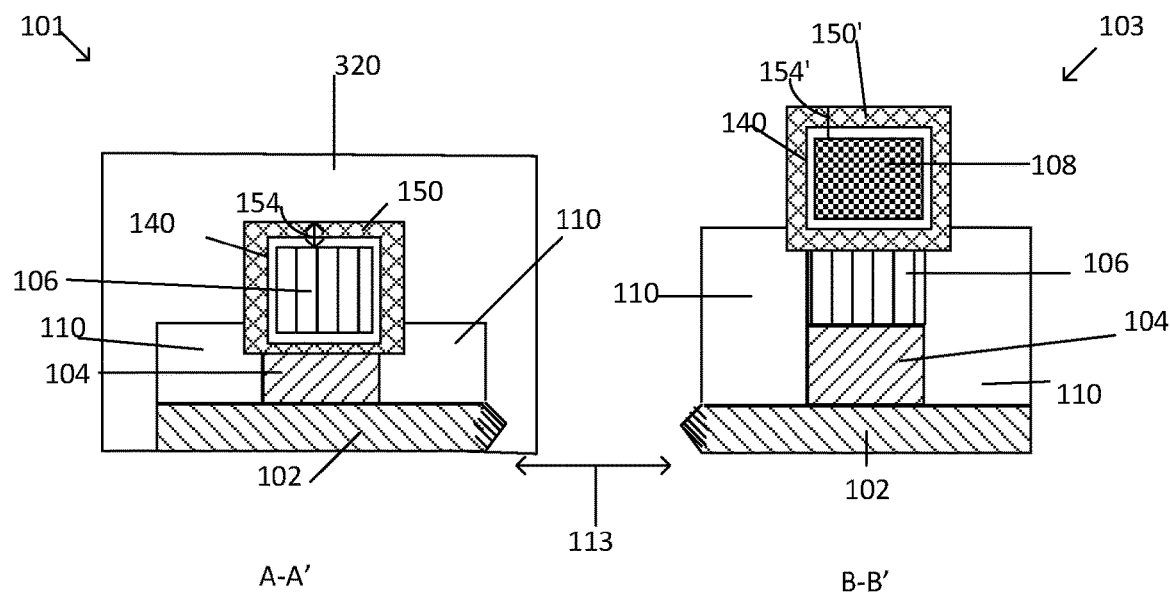

In FIGS. 3G-3H, a patterning material 320, such as a resist material, for example, is formed over the first transistor 101. In an embodiment, a plurality of first transistors 101 may be masked, and a plurality of high Vt transistors 103 may be formed on unmasked regions of the substrate 102. The isolation material 110 of the second transistor 103 is recessed to expose the sidewalls of the second III-V alloy 108 of the second transistor 103. A second gate stack 154' is formed on the second III-V alloy 108 of the second transistor 103. In an embodiment, the second gate stack 154' includes a gate material 150 on a gate dielectric 140. The second III-V alloy 108 is a high threshold voltage channel material, and the second transistor 103 is a high Vt device. In an embodiment, a plurality of high Vt devices 103 may be formed in desired locations on the substrate 102, and may be separated from a region of low Vt devices by a distance 213.

Figure 4A:
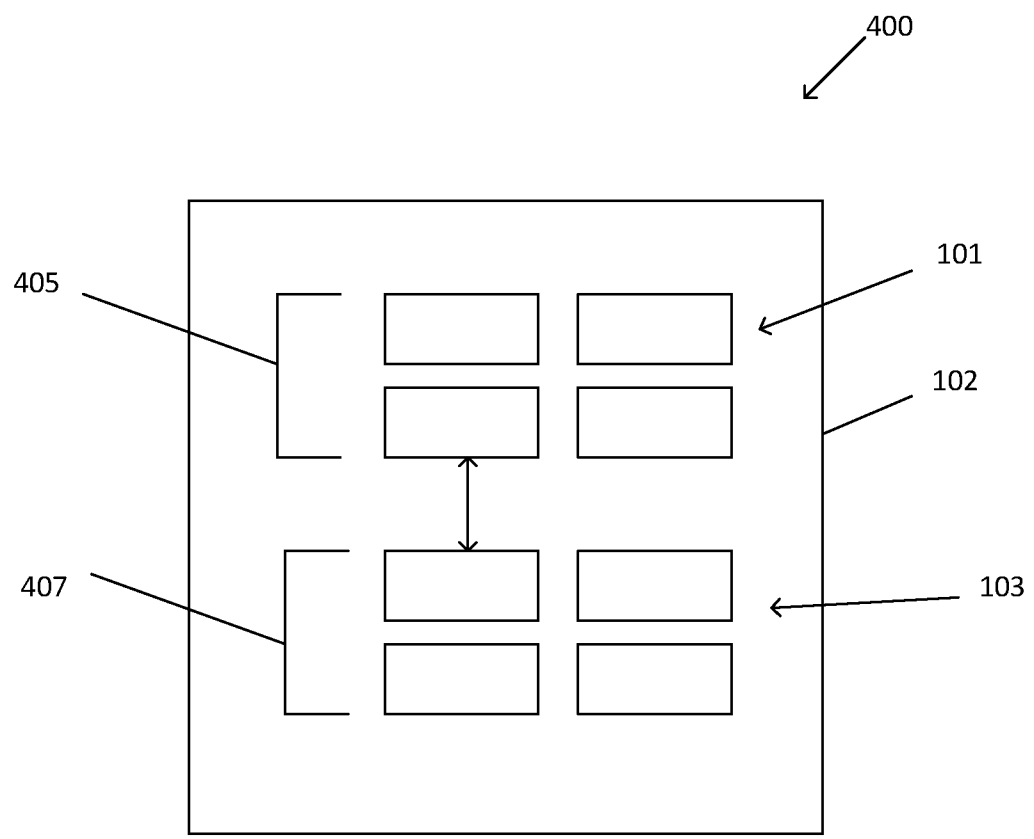
FIG. 4A illustrates a top view of a first and second nanowire transistors including multiple threshold voltage channel materials on a substrate, according to embodiments.

FIG. 4A depicts a top view of a device 400, where a plurality of low Vt transistors 101, are on a first region 405 of the substrate 102, and a plurality of high Vt devices 103, are on a second region 407 of the substrate 102. Any number of locations/regions of the pluralities of the low and high Vt transistors 101, 103 may be achieved by using known patterning techniques. In an embodiment, the device 400 is a device which supports both low power and high-performance cores on a chip. In an embodiment, a high-performance core of the device 400 includes a plurality of first transistors 101 having a low Vt, and a low power core of the device 400 includes a plurality of the second transistors 103 having a high Vt. In an embodiment, the device 400 supports such applications as internet of things, graphics and artificial intelligence.

Figure 4B:
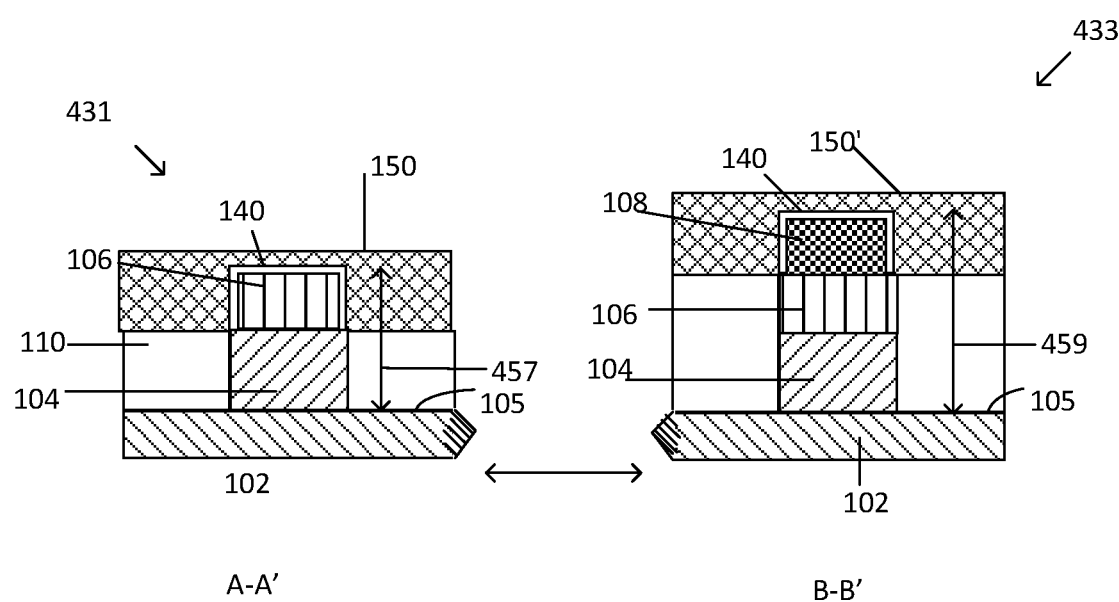
FIG. 4B illustrates cross-sectional views through widths of channel regions of a first and a second transistor including multiple threshold voltage channel materials on a substrate, according to embodiments.

In another embodiment, the low Vt and high Vt transistors of the embodiments herein may be incorporated in a trigate structure, and may be formed according to embodiments herein. In FIG. 4B, cross sectional views of a first trigate transistor 431 and a second trigate transistor 433 are depicted on a substrate 102. A first gate stack, comprising a gate electrode material 150 on a gate dielectric material 140, is on a first III-V alloy 106 of the first transistor 331. The first III-V alloy 106 is a low Vt channel material. The first III-V alloy 106 is a portion of a low Vt trigate fin structure, in an embodiment. The first III-V alloy 106 is on a buffer layer 104, which may be a sub-fin structure, in an embodiment. Isolation material 110 is adjacent sidewalls of the buffer layer 104.

The second transistor includes the second gate stack (gate electrode on the gate dielectric) on a second III-V alloy 308 of the second transistor 433. The second III-V alloy 108 is a channel material, in an embodiment. The second III-V alloy 108 is a portion of a high Vt trigate fin structure, in an embodiment. The second III-V alloy 108 may be disposed on a first IIIV-alloy 106, which may be disposed on a buffer layer 104. In an embodiment, a distance 457 between a first surface 105 of the substrate 102 and a top surface of the first III-V alloy 106 may be less than a distance 459 between the first surface 105 of the substrate 102 and a top surface of the second III-V alloy 108. In an embodiment, the first III-V alloy 106 of the second transistor 433 is an intervening material that is between the second III-V alloy 108 and the substrate 102, where the intervening material is a third III-V alloy.

Although exemplary III-V transistor structures and fin-FET embodiments are employed consistently herein for the sake of clarity of discussion, it is expected one of skill in the art familiar with the characteristics of alternate semiconductor material systems will be able to successfully apply the techniques described herein to other heteroepitaxial fin structures absent some specific a priori knowledge of a salient incompatibility between the exemplary III-V embodiments and the alternate material systems. For example, alternative non-silicon material systems, such as but not limited to, the III-N material system (e.g., AlN, GaN, AlGaN, InAlGaN) may also be amenable to the techniques and architectures described herein.

Figure 5:
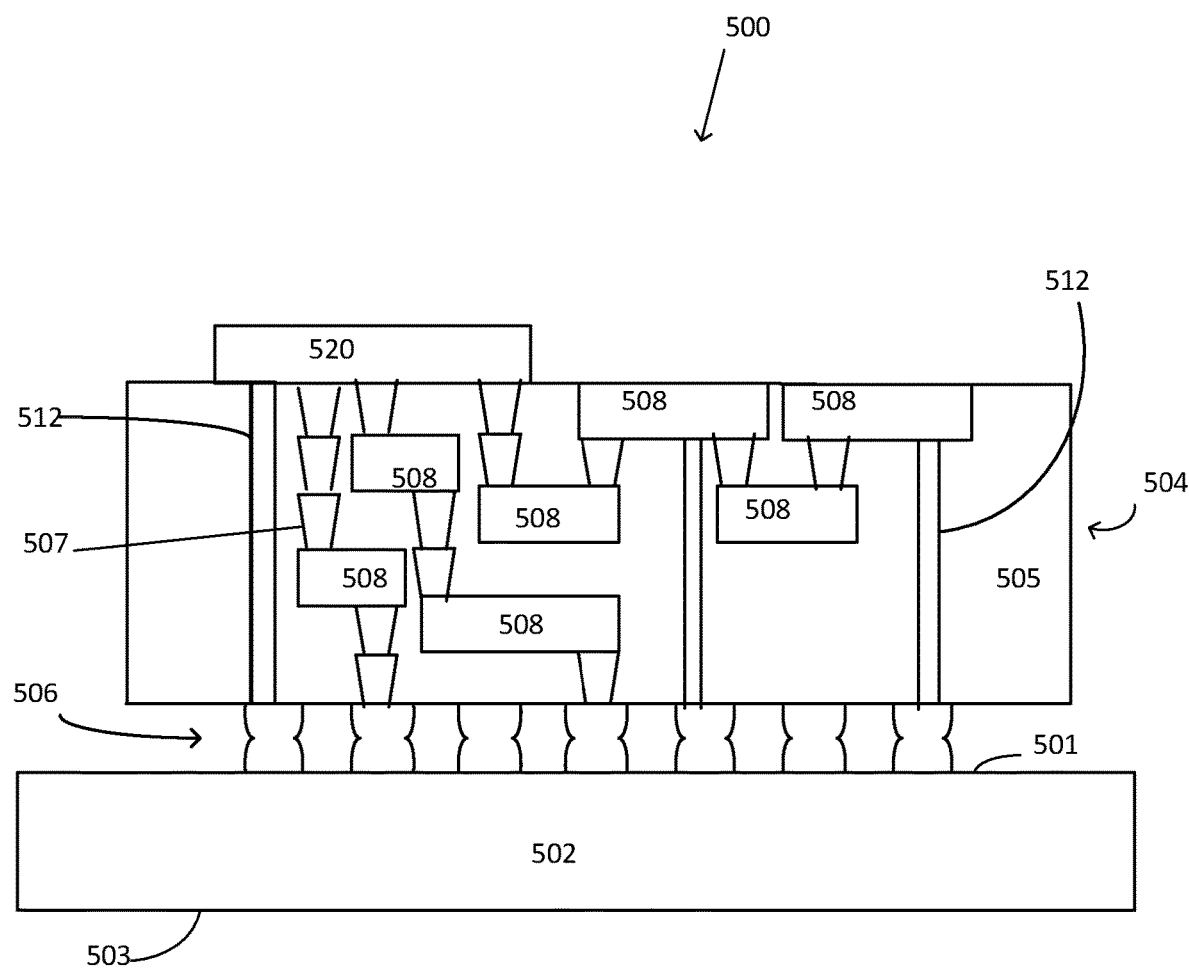
FIG. 5 is a cross-sectional view of a computing system employing transistors with multiple threshold voltage channel materials, in accordance with embodiments.

Turning now to FIG. 5, illustrated is a cross sectional view of an embodiment of a computing system 500. The system 500 includes a mainboard 502 or other circuit board. Mainboard 502 includes a first side 501 and an opposing second side 503, and various components may be disposed on either one or both of the first and second sides 501, 503. In the illustrated embodiment, the computing system 500 includes at least one device 520, such as a device as described in any of the embodiments herein comprising multiple Vt channel materials, such as those depicted in FIG. 1B, for example. The device 520 is on a surface (such as on a top or bottom or side surface) of a substrate 504, such as a package substrate. The substrate 504 may be an interposer 504, for example, or any other type of substrate, such as a cored substrate or a coreless substrate, for example.

The substrate 504 may include various conductive layers 508, for example, which may be electrically and physically connected to each other by via structures 507. The conductive layers 508 may be conductive traces in an embodiment. The substrate 504 may further include through substrate vias 512. Dielectric material 505 may separate/isolate conductive layers from each other within the substrate 504. Joint structures 506 may electrically and physically couple the substrate 504 to the board 502.

System 500 may be any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desktop computers and servers.

Mainboard 502 may be any suitable type of circuit board or other substrate capable of providing electrical communication between one or more of the various components disposed on the board. In one embodiment, for example, the mainboard 502 is a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 501. However, it should be understood that the disclosed embodiments are not limited to the above-described PCB and, further, that mainboard 502 may be any other suitable substrate.

Figure 6:
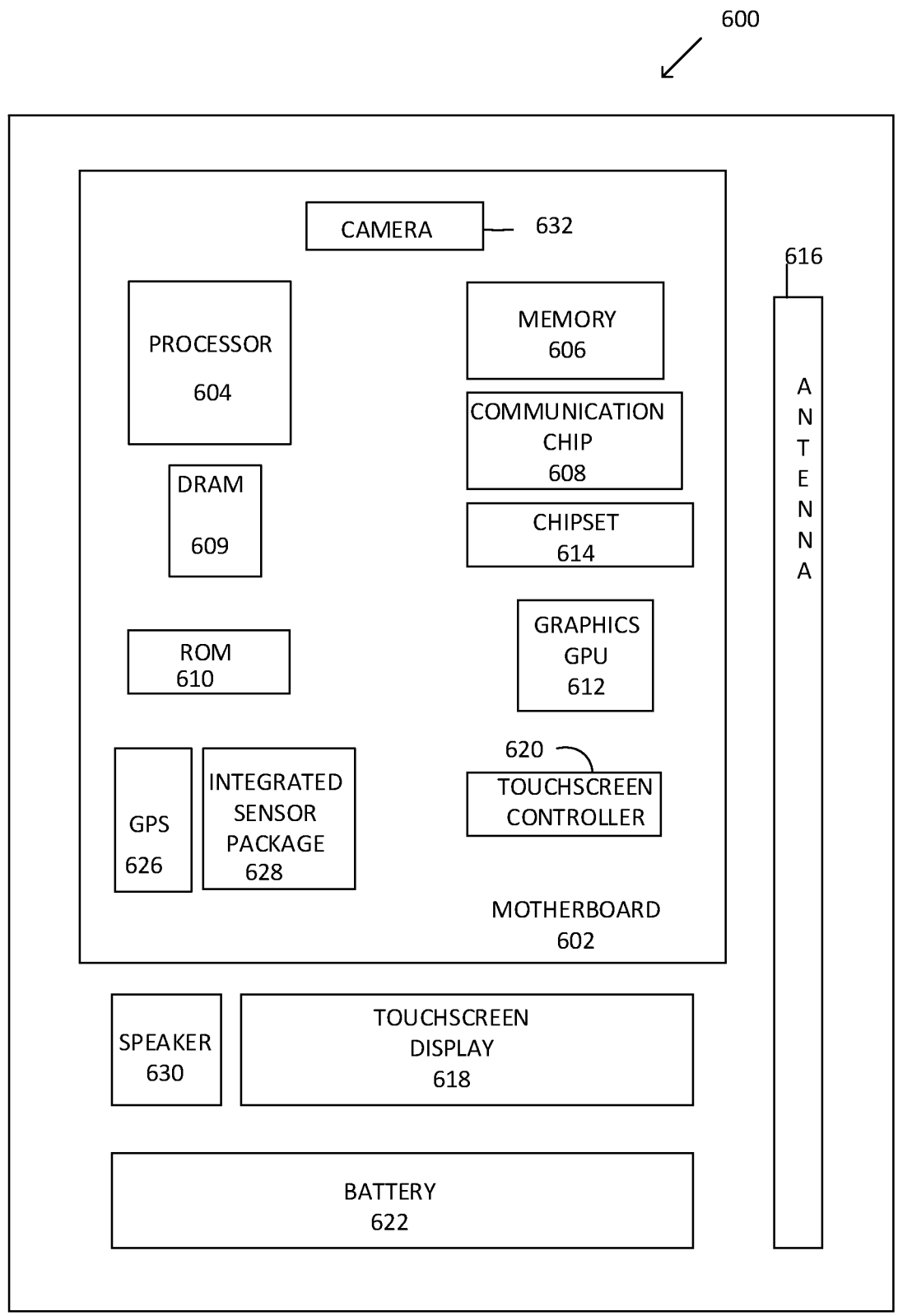
FIG. 6 is a functional block diagram of an electronic computing device employing transistors with multiple threshold voltage channel materials, in accordance with embodiments.

FIG. 6 is a schematic of a computing device 600 that may be implemented incorporating embodiments of the device structures described in any of the embodiments herein comprising multiple Vt channel materials, such as those depicted in FIG. 1B, for example. In an embodiment, the computing device 600 houses a board 602, such as a motherboard 602 for example. The board 602 may include a number of components, including but not limited to a processor 604, an on-die memory 606, and at least one communication chip 608. The processor 604 may be physically and electrically coupled to the board 602. In some implementations the at least one communication chip 608 may be physically and electrically coupled to the board 602. In further implementations, the communication chip 608 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 609, non-volatile memory (e.g., ROM) 610, flash memory (not shown), a graphics processor unit (GPU) 612, a chipset 614, an antenna 616, a display 618 such as a touchscreen display, a touchscreen controller 620, a battery 622, an audio codec (not shown), a video codec (not shown), a global positioning system (GPS) device 626, an integrated sensor 628, a speaker 630, a camera 632, an amplifier (not shown), compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims. For example, the above embodiments may include specific combinations of features as further provided below.

Example 1 is a device, comprising: a first nanowire transistor, comprising: a first source and a first drain with a first channel therebetween, wherein the first channel comprises a first III-V alloy; a first gate stack around the first channel, wherein; a portion of the first gate stack is between the first channel and a substrate, the first gate stack comprises a gate electrode metal in contact with a gate dielectric; and a second nanowire transistor, comprising: a second source and a second drain with a second channel therebetween, wherein the second channel comprises a second III-V alloy; a second gate stack around the second channel, wherein: a portion of the second gate stack is between the second channel and an intervening material that is between the second gate stack and the substrate; the intervening material comprises a third III-V alloy; and the second gate stack also comprises the gate electrode metal in contact with the gate dielectric.

Example 2 includes the device of example 1, wherein the gate electrode metal has a first work function difference with the first III-V alloy and has a second work function difference with the second III-V alloy.

Example 3 includes the device of example 2, wherein the first work function difference is smaller than the second work function difference and the first transistor has a first threshold voltage (Vt), smaller than a second Vt of the second transistor.

Example 4 includes the device of example 3, wherein the first III-V alloy has a smaller band gap than the second III-V alloy.

Example 5 includes the device as in examples 3 or 4, wherein at least one of the first and second III-V alloys comprise a ternary or quaternary alloy.

Example 6 includes the device of example 5, wherein at least one of the first and second III-V alloys comprise a binary alloy.

Example 7 includes the device of example 6, wherein the first and second III-V alloys comprise indium.

Example 8 includes the device of example 7, wherein the first III-V alloy comprises indium, gallium, and arsenic, and wherein the second III-V alloy comprises indium and phosphorus.

Example 9 includes the device as in any one of the preceding examples, wherein the first channel comprises a first lattice constant, and the second channel material comprises a second lattice constant, wherein the first lattice constant and the second lattice constant are matched with each other.

Example 10 includes the device as in any one of the preceding examples, wherein the first gate stack comprises a first distance from a first surface of the substrate to a first surface of the first gate stack, and the second gate stack comprises a second distance from the first surface of the substrate to a first surface of the second gate stack, wherein the first distance is different than the second distance.

Example 11 includes the device of example 10, wherein a second surface of the second gate stack is higher than a second surface of the first gate stack.

Example 12 includes the device as in any one of the preceding examples, wherein a first plurality of first nanowire transistors located on a first region on the substrate, and a second plurality of second nanowire transistors is located on a second region of the substrate.

Example 13 is a processor, comprising: a high performance core comprising a plurality of first transistors, wherein individual ones of the first transistors further comprise: a first source and a first drain with a first channel therebetween, wherein the first channel comprises a first III-V alloy; a first gate stack around the first channel, wherein; a portion of the first gate stack is between the first channel and a substrate; the first gate stack comprises a gate electrode metal in contact with a gate dielectric; and a low-power core comprising a plurality of second transistors, wherein individual ones of the second transistors further comprise: a second source and a second drain with a second channel therebetween, wherein the second channel comprises a second III-V alloy; a second gate stack around the second channel, wherein: a portion of the second gate stack is between the second channel and an intervening material that is between the second gate stack and the substrate; the intervening material comprises a third III-V alloy; and the second gate stack also comprises the gate electrode metal in contact with the gate dielectric, wherein the gate electrode metal has a first work function difference with the first III-V alloy that is smaller than a second work function difference with the second III-V alloy, and the first transistors have a first threshold voltage (Vt) that is smaller than a Vt of the second transistors.

Example 14 includes the processor of example 13, further comprising a power management circuit to power the low-power core while power gating the high-performance core.

Example 15 includes the processor as in example 13 or 14, wherein at least one of the first and second III-V alloys comprise a ternary or quaternary alloy and at least one of the first and second III-V alloys comprise a binary alloy.

Example 16 is a method, comprising: forming openings in a dielectric material over a substrate; forming a stack of epitaxial layers over the substrate and within the openings, wherein the stack comprises a first layer comprising a first III-V alloy on the substrate, a second layer comprising a second III-V alloy on the first layer, and a third layer comprising a third III-V alloy on the second layer; forming a first transistor in the first of the openings, the first transistor including a first gate stack over the second layer, wherein the first gate stack comprises a gate electrode metal in contact with a gate dielectric in contact with the second III-V alloy; and forming a second transistor over a second of the openings, the second transistor including a second gate stack over the third layer, wherein the second gate stack also comprises the gate electrode metal in contact with the gate dielectric, and wherein the gate dielectric is in contact with the third III-V alloy.

Example 17 includes the method of example 16, wherein forming the first gate stack further comprises epitaxially growing the second III-V alloy from a surface of the first III-V alloy, and wherein the second III-V alloy has a smaller band gap than the third III-V alloy.

Example 18 includes the method of example 17, wherein the substrate comprises silicon and forming the stack further comprises epitaxially growing the first III-V alloy on a surface of the silicon.

Example 19 includes the method as in example 17 or 18, wherein the second and third III-V alloys comprise indium.

Example 20 includes the method of example 19, wherein one of the second and third III-V alloys comprises indium, gallium, and arsenic, and wherein another of the first and second III-V alloys comprises indium and phosphorus.

Example 21 includes the method as in any one of examples 16-20, further comprising: recessing the dielectric material adjacent to the first opening to expose a sidewall of a portion of the second layer; and wherein forming the first gate stack comprises replacing the portion of the second layer with a portion of the second gate stack.

Example 22 includes the method of example 21, further comprising: recessing the dielectric material adjacent to the second opening to expose a sidewall of a portion of the third layer, and wherein forming the second gate stack comprises replacing the portion of the third layer with a portion of the second gate stack.

Example 23 includes the method as in any one of examples 16-22, wherein forming the second layer comprises forming one or more of indium gallium arsenide (InGaAs), indium arsenide (InAs), indium antimonide (InSb), indium gallium antimonide, (InGaSb), indium gallium arsenide antimonide (InxGa1-xAsySb1-y), indium gallium arsenide phosphide (InxGa1-xAsyP1-y), indium gallium phosphide antimonide (InxGa1-xPySb1-y), indium aluminum arsenide antimonide (InxAl1-xAsySb1-y), indium aluminum arsenide phosphide (InxAl1-xAsyP1-y), and any combination thereof.

Example 24 includes the method as in any one of examples 16-23, wherein forming the third layer comprises epitaxially forming one or more of gallium arsenide (GaAs), indium phosphide (InP), gallium phosphide (GaP), gallium arsenide (GaAs), indium gallium phosphide (InGaP), aluminum gallium arsenide (AlxGa1-xAs), gallium arsenide antimonide (GaAsxSb1-x) (where 0≤x≤1), indium gallium arsenide antimonide (InxGa1-xAsySb1-y), indium gallium arsenide phosphide (InxGa1-xAsyP1-y), indium gallium arsenide phosphide antimonide (InxGa1-xPySb1-y), indium aluminum arsenide antimonide (InxAl1-xAsySb1-y), indium aluminum arsenide phosphide (InxAl1-xAsyP1-y) and combinations thereof.

Example 25 includes the method as in any one of examples 16-24, wherein forming the first transistor comprises forming a plurality of first transistors in a first region of the substrate, and wherein forming the second transistor comprises forming a second plurality of transistors in a second region of the substrate.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A device structure, comprising:
 a first nanowire transistor with a first threshold voltage ($V_t$), the first transistor comprising:
  a first source and a first drain with a first channel therebetween, wherein the first channel comprises a first III-V alloy; and
  a first gate stack around the first channel, wherein;
   a portion of the first gate stack is between the first channel and a substrate; and
   the first gate stack comprises a gate electrode metal in contact with a gate dielectric; and
 a second nanowire transistor with a second $V_t$, different than the first $V_t$, the second transistor comprising:
  a second source and a second drain with a second channel therebetween, wherein the second channel comprises a second III-V alloy, different than the first III-V alloy; and
  a second gate stack around the second channel, wherein:
   a portion of the second gate stack is between the second channel and an intervening material that is between the second gate stack and the substrate;
   the intervening material comprises a third III-V alloy; and
   the second gate stack also comprises the gate electrode metal in contact with the gate dielectric.

2. The device structure of claim 1, wherein the gate electrode metal has a first work function difference with the first III-V alloy and has a second work function difference with the second III-V alloy.

3. The device structure of claim 2, wherein the first work function difference is smaller than the second work function difference and the first transistor has a first threshold voltage ($V_t$), smaller than a second $V_t$ of the second transistor.

4. The device structure of claim 1, wherein the first III-V alloy has a smaller band gap than the second III-V alloy.

5. The device structure of claim 1, wherein at least one of the first and second III-V alloys comprise a ternary or quaternary alloy.

6. The device structure of claim 5, wherein at least one of the first and second III-V alloys comprise a binary alloy.

7. The device structure of claim 6, wherein the first and second III-V alloys comprise indium.

8. The device structure of claim 7, wherein the first III-V alloy comprises indium, gallium, and arsenic, and wherein the second III-V alloy comprises indium and phosphorus.

9. The device structure of claim 1, wherein:
the first gate stack has a first thickness between the first channel and the substrate;
the first thickness is substantially equal to a thickness of the intervening material in a direction orthogonal to a plane of the substrate;
the second gate stack has a second thickness between the second channel and the intervening material; and
the second thickness is substantially equal to a thickness of the first channel in the direction orthogonal to the plane of the substrate.

10. The device structure of claim 9, wherein the first gate stack has a third thickness over the first channel that is at least equal to a thickness of the second channel, in the direction orthogonal to the plane of the substrate.

11. The device structure of claim 10, wherein the second gate stack has a fourth thickness over the second channel that is less than the third thickness.

12. The device structure of claim 11, wherein the third thickness is substantially equal to the fourth thickness added to the thickness of the second channel.

13. A processor, comprising:
a plurality of first transistors, wherein individual ones of the first transistors further comprise:
a first source and a first drain with a first channel therebetween, wherein the first channel comprises a first III-V alloy; and
a first gate stack around the first channel, wherein;
a portion of the first gate stack is between the first channel and a substrate; and
the first gate stack comprises a gate electrode metal in contact with a gate dielectric; and
a plurality of second transistors, wherein individual ones of the second transistors further comprise:
a second source and a second drain with a second channel therebetween, wherein the second channel comprises a second III-V alloy; and
a second gate stack around the second channel, wherein:
a portion of the second gate stack is between the second channel and an intervening material that is between the second gate stack and the substrate;
the intervening material comprises a third III-V alloy; and
the second gate stack also comprises the gate electrode metal in contact with the gate dielectric,
wherein the gate electrode metal has a first work function difference with the first III-V alloy that is smaller than a second work function difference with the second III-V alloy, and the first transistors have a first threshold voltage ($V_t$) that is smaller than a $V_t$ of the second transistors.

14. The processor of claim 13, further comprising a power management circuit to power the second plurality of transistors while power gating the first plurality of transistors.

15. The processor as in claim 13, wherein at least one of the first and second III-V alloys comprise a ternary or quaternary alloy and at least one of the first and second III-V alloys comprise a binary alloy.

16. A method, comprising:
forming a stack of epitaxial layers over the substrate, wherein the stack comprises a first layer comprising a first III-V alloy over the substrate, a second layer comprising a second III-V alloy over the first layer, and a third layer comprising a third III-V alloy over the second layer, wherein the second and third III-V alloys have different band gaps;
forming a first transistor including a first gate stack adjacent to a sidewall of the second layer, wherein the first gate stack comprises a gate electrode metal in contact with a gate dielectric in contact with the second III-V alloy; and
forming a second transistor including a second gate stack adjacent to a sidewall of the third layer, wherein the second gate stack also comprises the gate electrode metal in contact with the gate dielectric, and wherein the gate dielectric is in contact with the third III-V alloy.

17. The method of claim 16, wherein forming the stack of epitaxial layers further comprises epitaxially growing the second III-V alloy from a surface of the first III-V alloy, and wherein the second III-V alloy has a smaller band gap than the third III-V alloy.

18. The method of claim 17, wherein the substrate comprises silicon and forming the stack of epitaxial layers further comprises epitaxially growing the first III-V alloy on a surface of the silicon.

19. The method as in claim 17, wherein the second and third III-V alloys comprise indium.

20. The method of claim 19, wherein one of the second and third III-V alloys comprises indium, gallium, and arsenic, and wherein another of the first and second III-V alloys comprises indium and phosphorus.

* * * * *